United States Patent [19]

Wood

[11] 4,280,775
[45] Jul. 28, 1981

[54] HOLE DRILLING MACHINE AND WORK POSITIONING SYSTEM

[76] Inventor: Ross C. Wood, 633 California St., El Segundo, Calif. 90245

[21] Appl. No.: 917,298

[22] Filed: Jun. 20, 1978

[51] Int. Cl.$^3$ ............................................. B23B 39/08
[52] U.S. Cl. .......................................... 408/3; 408/4; 408/7; 408/50; 408/51; 408/53; 408/56; 408/69; 409/106
[58] Field of Search ...................... 408/3, 4, 7, 13, 43, 408/50, 51, 52, 53, 56, 59; 409/192, 203, 217, 219, 904, 91, 105, 106, 108; 83/402, 409, 409.1, 410

[56] References Cited

U.S. PATENT DOCUMENTS

| | | | |
|---|---|---|---|
| 2,651,549 | 9/1953 | Ross | 83/402 X |
| 2,945,600 | 7/1960 | Thumin | 83/402 X |
| 3,041,896 | 7/1962 | May | 408/56 |
| 3,376,764 | 4/1968 | Schardt | 408/91 X |
| 3,532,893 | 10/1970 | Marantette et al. | 408/3 |
| 3,546,978 | 12/1970 | Keown | 408/3 |
| 3,663,114 | 5/1972 | Welsh et al. | 408/3 |
| 4,143,868 | 3/1979 | Bergman | 408/76 X |

*Primary Examiner*—Z. R. Bilinsky
*Attorney, Agent, or Firm*—Henry M. Bissell

[57] ABSTRACT

A system for controllably positioning printed circuit boards or the like for the automatic drilling of holes therein. A plurality of individual work positions is provided, together with corresponding work carrier plates having individual or groups of circuit boards affixed thereto. Each work position includes a work table, a drilling machine with associated control equipment, a carrier plate for the circuit boards, and means for supporting the carrier plate and circuit boards above the work table with minimal resistance to lateral movement of the carrier plate and boards. The carrier plates are tied to a central drive system controlled by an automatic control unit in a manner which rigidly maintains close tolerances to lateral movement while permitting vertical displacement relative to the work tables. A master table is included for the drilling of a master template and to prevent displacement errors in the holes to be drilled. The drilling machines employed in the system may be independently activated in accordance with the quantity of production and the number of work positions needed in any given hole drilling operation and incorporate various interlocked fail-safe mechanism, some of which are individually adjustable, to simplify the construction and operation of the system while insuring coordinated control of the plurality of drilling machines.

45 Claims, 11 Drawing Figures

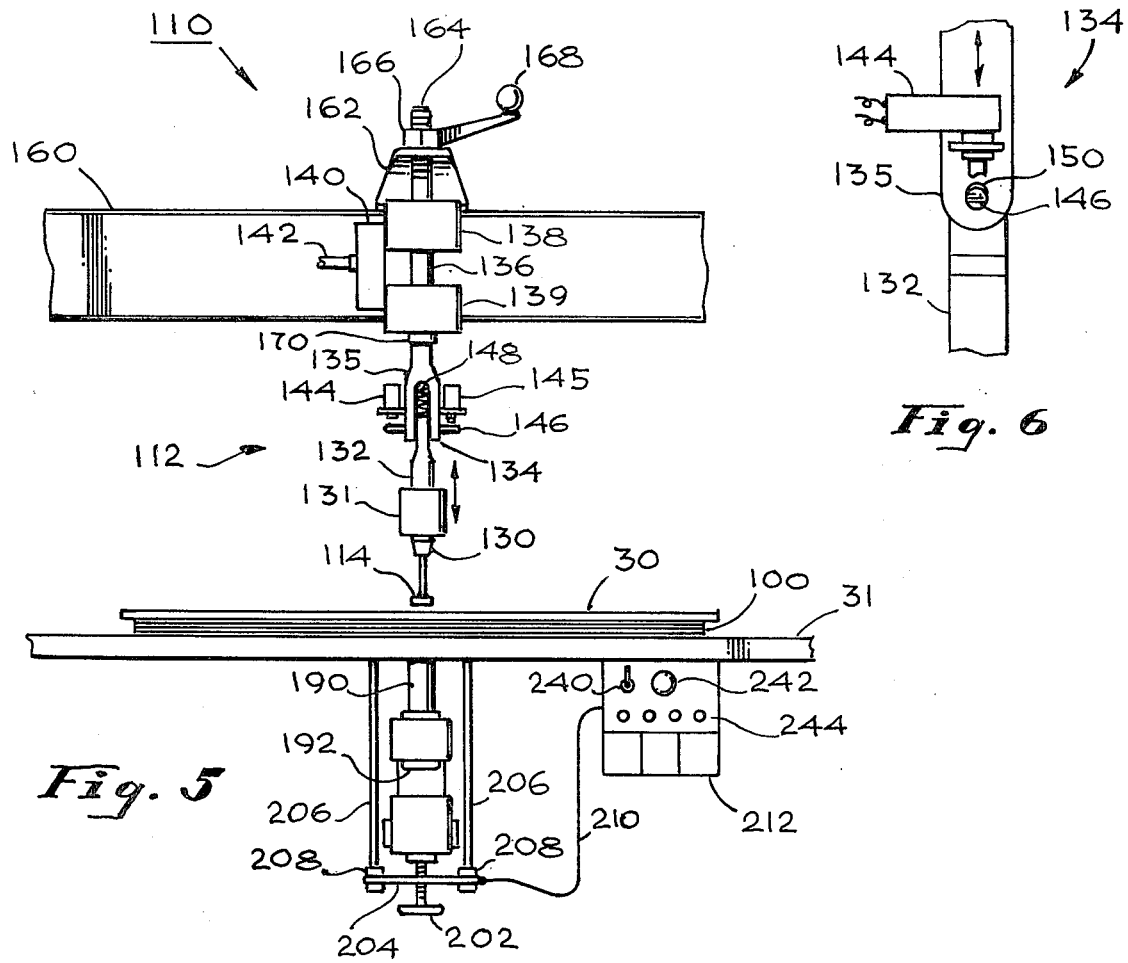
Fig. 5
Fig. 6
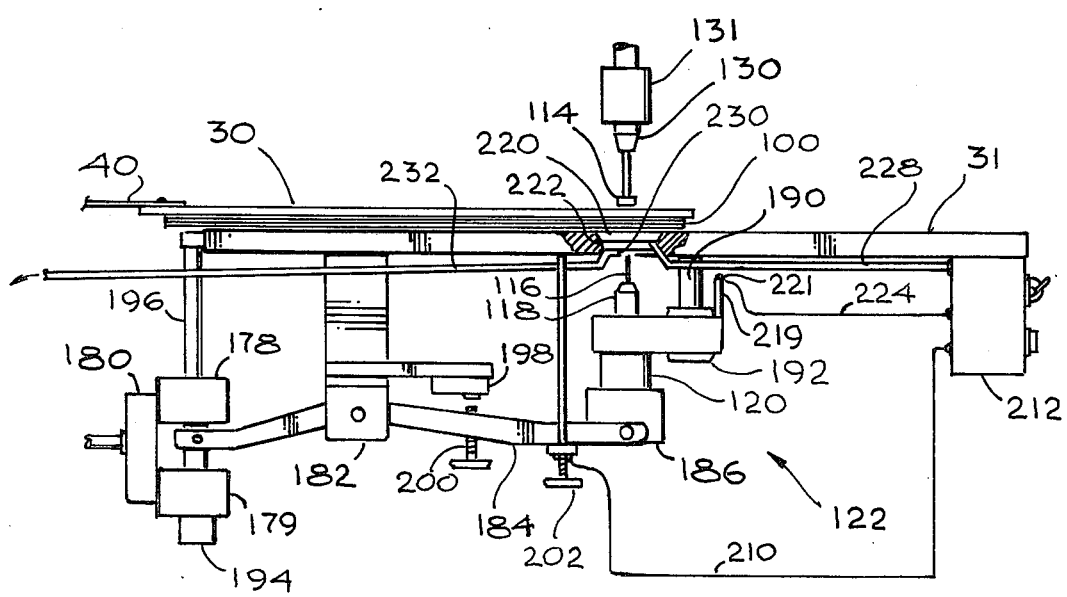
Fig. 7

HOLE DRILLING MACHINE AND WORK POSITIONING SYSTEM

BACKGROUND OF THE INVENTION

1. Field of the Invention

This invention relates to a system for automatically positioning a workpiece in a machining operation at a succession of coordinate points in an X-Y coordinate plane and, more particularly, to a system for automatically positioning a plurality of printed circuit boards and drilling holes therein under the control of an automatic control unit.

2. Description of the Prior Art

Printed circuit boards are widely used in the electronics field and in related technologies. Such printed circuit boards are typically laminated of at least a substrate layer and one or more layers of copper. The boards are customarily drilled with holes for the insertion of various electrical components to be mounted on the boards. The holes must be drilled, not punched, in a controlled fashion to limit damage to the areas surrounding the holes and to avoid smearing between layers. Each circuit board with typically have a relatively large number of holes to be drilled through it.

It will therefore be recognized that the drilling of holes in printed circuits is a tedious and time-consuming task. Various systems have been devised in order to automate the procedure. A plurality of boards may be mounted in a single work station for drilling simultaneously. Numerically controlled drill-positioning systems are in present use commercially, employing a tape-driven control unit in conjunction with a movable drill head which repeats the drilling operation at the various positions to which it is directed by the control unit. The tape fed into the control unit contains the program indicating the number and position of holes to be drilled in the circuit board. However, such a system is necessarily restrictive in the number of circuit boards which can be processed in a given time period since for quality production only a few boards can be stacked together for simultaneous drilling. The use of a control unit for each station increases the cost of the drilling system, and the mechanism for positioning the drill is not only expensive to provide on a per-unit basis but is complex and prone to breakdown.

Other types of automatic positioning systems for the automatic drilling of holes in printed circuit boards which eliminate the need for control by a tape driven control unit are known. An example of such a system which uses a master template and a photocell, hole-location system is disclosed in the Marantette et al U.S. Pat. No. 3,532,893. However, while eliminating the need for the expensive and complex tape-driven control unit of the first type of system described hereinabove, systems of this type depend upon a plurality of servo devices for positioning the boards at the respective work positions, thus necessarily introducing a factor of cost from the replication of such items at multiple work positions. Moreover, such systems are subject to their own position error problems, particularly the photo detection systems which rely on a null signal for determining the selected position for drilling.

A system is desired which is responsive to an automatic control unit driven by a paper tape or the like so as to develop the precision in position location which is possible from the use of stepping motors but without the associated cost which is necessarily involved where such a control unit is required for each hole drilling machine. If a plurality of hole drilling machines could be controlled from a single control unit with the precision which is required in such an operation, the cost per work position could be reduced by spreading the control unit cast over the number of work positions employed, thus reducing the cost of drilling the holes, and the rate of production of drilling circuit boards could be increased, since more circuit boards would be drilled at the same time. I have devised such a system.

SUMMARY OF THE INVENTION

In brief, arrangements in accordance with the present invention incorporate a plurality of work tables, each one having its own hole drilling machine associated therewith, coupled to be controlled by a single tape-driven automatic control unit. Also associated with each work table and drilling machine is a carrier plate to which the printed circuit boards are mounted. In the preferred embodiment the printed circuit boards are affixed to the underside of the carrier plate by locator pins for movement with the carrier plate over the upper surface of the work table in the X-Y (horizontal) plane. All of the carrier plates are tied to a central drive frame member by means of bridged struts which rigidly fix the carrier plates relative to the drive frame member in the X and Y directions while providing flexibility and permitting vertical (Z direction) displacement of the carrier plates on an individual basis as called for in the operation of the system. The drive frame member is itself mounted on a pair of X-Y positioning tables of a type commercially available for association with a tape driven control unit. Two such tables are employed, rather than one as is the ordinary case, in order to provide additional precision in the positioning of the drive frame member, and thereby the associated carrier plates. These tables are of the conventional kind supported by ball bushings on longitudinal and transverse ways and driven by respective X and Y stepping motors controllable with a precision in location to 0.0001 inch or better.

In a preferred embodiment of my invention, I incorporate 20 work tables coupled together for driving in unison, 10 on each side of the central longitudinal drive frame member. The two X-Y drive tables are displaced longitudinally along the drive frame member. In accordance with an aspect of this invention, the X-drive stepping motors of the two tables are coupled together by a common shaft so as to insure that the rotors of these two drive motors move in unison.

In order for the respective stepping motors of the X and Y drive tables to be able to move all of the 20 carrier plates in unison, it is essential that a virtually frictionless support be provided for the respective carrier plates and the printed circuit boards which are mounted to move with them. This is accomplished in accordance with an aspect of the invention by a fluid film support arrangement. Each drive table is provided with a series of ball-type air valves coupled to a low pressure pneumatic system. These valves are mounted flush with the upper surface of the table on approximately 6-inch centers. Each valve is so constructed that the central ball, which serves to block the release of air through the valve when in the closed position, protrudes approximately 0.020 inch above the surface of the table. As the carrier plate with (or without) attached circuit boards moves over a given ball valve, the downward pressure causes the ball to retract slightly and release air through the valve. This air, joining with air from other valves similarly depressed underneath the carrier plate, develops a fluid film which supports the carrier plate so that it may be moved laterally without frictional resistance. When a carrier plate moves away from a given valve, the air pressure underneath the ball forces it against its seat so that the valve is closed. In this manner the opening and closing of the air valves and the development of the supporting fluid film is automatic. The desired frictionless support of the carrier plates and associated printed circuit boards is provided without the undesired release of pressurized air from the system through ports that are not positioned under a carrier plate at any given moment. Stainless steel spring elements in the strut system tying the carrier plates to the central drive frame member permit the lifting of the carrier plates by the supporting air film and the individual movement of a carrier plate downward against the work table by a pressure foot immediately prior to the drilling of each individual hole, as will be explained hereinbelow.

By virtue of this arrangement in accordance with the invention, the work positions can be placed relatively close together. The work tables of the 10 work positions in line on one side of the central longitudinal drive frame member in the example described comprise a continuous work table extending from end to end. The carrier plate of a given work position moves across work table space shared with adjacent work positions on either side, since all of the carrier plates move in unison and cannot possibly interfere with each other.

Each drilling machine includes drilling apparatus which, in addition to the carrier plate and the work table with pneumatic support system over which it moves, incorporates a pressure foot and a drill head, each with an associated actuator, mounted for vertical movement in opposition to each other on opposite sides of the carrier plate, the drill head being operative to drill the holes from underneath the work table. The respective actuators are alike, each being a dual-piston actuator with associated solenoid operated valves. Associated micro-switches are incorporated with the drilling apparatus for each work station so as to provide a reliable, fail-safe system. By means of such an arrangement in accordance with the invention, the position of the pressure foot is monitored so that the drill head actuator cannot be energized until the pressure foot is bearing down on the carrier plate, holding the plate and attached circuit boards against the table, and ready for the hole to be drilled. Similarly, the position of the drill head is monitored so that the pressure foot cannot be withdrawn until the drill head is retracted to its home position. Finally, the signal to the central control unit indicating that a given hole drilling cycle has been completed cannot be sent until all of the pressure feet at all of the operative work stations have been retracted. Any one or more of the individual work stations can be turned off and removed electrically from the string of those in the operative control loop associated with the central control unit. Thus, although the carrier plate for such a disconnected work station would move with the central drive frame member, no operation of the pressure foot and drill head actuators at such a work station would occur.

In accordance with a further aspect of the invention, one of the 20 work stations is a master station which, in effect, is used to monitor the position of the entire system and will disable the drill actuators of the individual work positions if the system is not precisely located as it should be for the drilling of an individual hole. At the master work position, a template or master is mounted on top of the carrier plate, rather than underneath, and a small rod or probe, rather than a pressure foot, is installed.

When a master circuit board template is to be drilled, all of the work stations are turned off except the No. 1 station which constitutes the master work station. A pressure foot is mounted in the actuator spindle chuck above the work table and the master station is used in conventional work station fashion to drill the holes in the master template under the control of the central control unit. During a production run, however, the master station is used to perform a monitoring function with respect to the operation of the central control unit and the carrier plate drive system in comparison with the master circuit board template which was previously drilled. At the master station, the template is mounted on top of the carrier plate and the pressure foot is replaced by a probe and associated switch support structure. The circuitry for energizing the drill motor and associated drill head actuator at the master station is disconnected during this phase in the production process.

At the master station, the upper actuator is arranged, in accordance with an aspect of the invention, to move its spindle slightly ahead of the pressure foot actuators at the work stations. Thus the probe at the master station reaches the master circuit board template first and determines if there is a hole in the master template at the position assumed by the drive system at the beginning of the cycle. If the master template does not contain a hole at the point positioned under the probe or if the hole at that position is slightly out of alignment with the probe so that the probe contacts the template at the edge of the hole, the probe will be deflected upwardly against a spring mounting arrangement. This closes an associated micro-switch which disables the entire system and prevents the drills at the various work stations from being moved upwardly against the respective circuit boards. Thus, the system is prevented from drilling holes in the circuit boards at points where they are not intended (in comparison with the master template) or are not properly aligned (again by comparison with the master). When such a disablement occurs, a signal is provided to the operator who can then inspect the equipment to determine where the discrepancy has developed.

In accordance with a further aspect of the invention, certain of the elements included in the individual drilling machines are made adjustable as to position so as to facilitate the set up of the machines in preparation for a drilling operation and to relieve the tolerance limits on the manufacturing of the individual drilling apparatus at the respective work positions. Each of the pressure foot support mechanisms with its associated actuator is adjustable vertically. The pressure foot extension mechanism incorporates a pair of micro-switches which are used to determine when the pressure foot is extended in contact with the carrier plate and when it is retracted. The vertical adjustment of the support mechanism is effected by a threaded support shaft affixed to the overhead truss which supports all of the pressure foot drive mechanisms. The support mechanism is adjustable to effect a fine positioning of the pressure foot micro-switches relative to the desired travel of the pressure foot. During set up for production, for example, the threaded support shaft is adjusted to allow for the number of individual circuit boards mounted to the carrier plate at a given work position.

A further micro-switch is provided to detect the movement of the drill head to the limit of its intended travel. This micro-switch is activated by a threaded push rod which can be adjusted in accordance with the intended travel of the drill head which will vary, for example, with the number of circuit boards being drilled at a given work position. There is also a second threaded push rod bearing a contact element to complete a circuit when the drill head returns to its retracted or home position. These various adjustable elements are incorporated in the electrical interlock circuitry of the apparatus to insure fail-safe operation of the system. Their adjustability facilitates the setting up of the system in preparation for production drilling operation while simplifying the fabrication and utilization of the system.

BRIEF DESCRIPTION OF THE DRAWING

A better understanding of the present invention may be had from a consideration of the following detailed description, taken in conjunction with the accompanying drawings, in which:

FIG. 5 is a front elevation of a drilling machine employed in the system of FIG. 1;

FIG. 6 is a detailed view of a portion of the apparatus of FIG. 5;

FIG. 7 is a side elevational view showing particular details of the arrangement of FIG. 5;

DESCRIPTION OF THE PREFERRED EMBODIMENT

Figure 1:
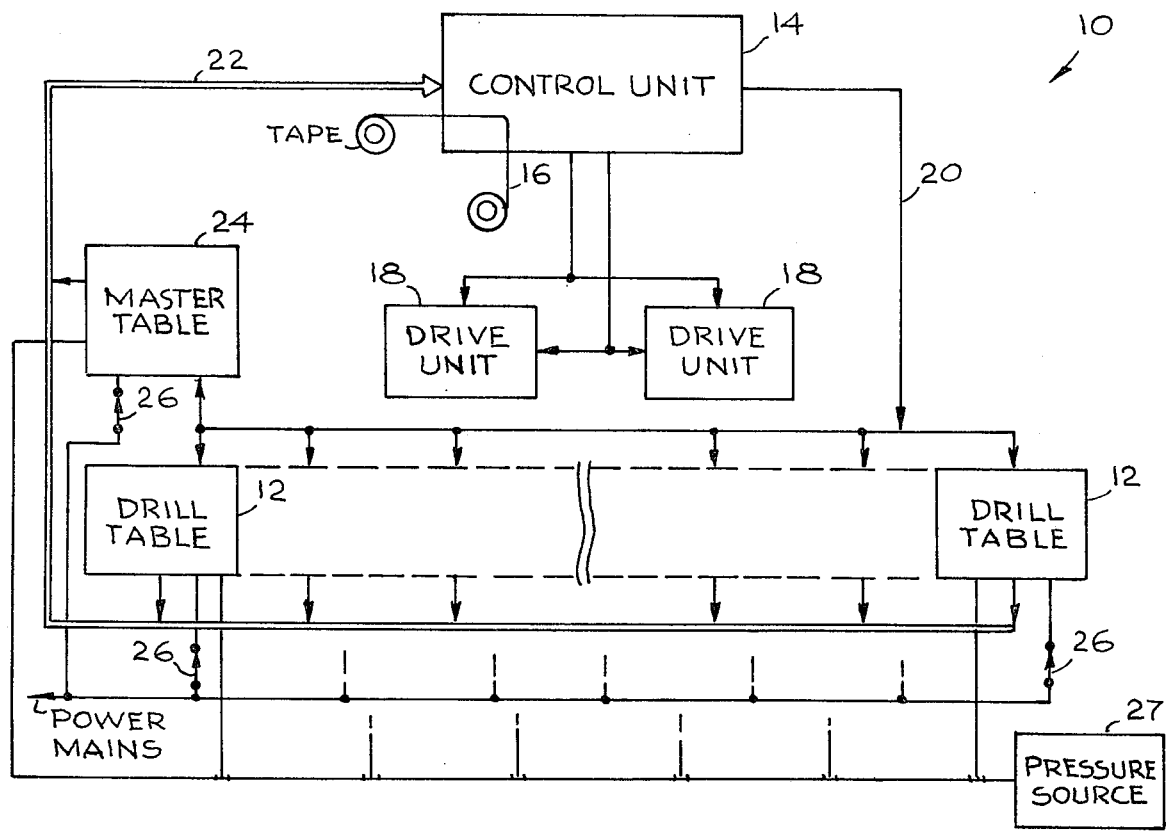
FIG. 1 is a schematic block diagram representing an overall system in accordance with the present invention.

An overall system 10 in accordance with the invention is illustrated in schematic form in the block diagram of FIG. 1. As shown, the system 10 comprises a plurality of drill tables or work stations 12 associated with a master control unit 14 driven by a tape 16 to control a pair of drive units 18. As will be shown in further detail hereinbelow, the drive units 18 serve to position the work on the respective drill tables 12 for, in the case of the preferred embodiment, drilling a plurality of holes in printed circuit boards mounted at the various work stations 12. Signal lines 20 and 22 serve to direct electrical control signals between the control unit 14 and the drill tables 12, as well as to an additional station designated the master table 24. Power main connections to the drill tables 12 and the master table 24 are provided by switches 26. Each of the stations 12 and 24 is also coupled to an air pressure source 27. It will be understood that, as indicated in FIG. 1, the number of drill tables 12 may be varied to suit the user of the system. In my preferred embodiment, I provide two rows of 10 tables each with the master table 24 occupying one of the 20 positions. Also as indicated in FIG. 1, the number of drill tables or work stations 12 actually used at any given time may be varied by disconnecting selected ones of the switches 26 from electrical power.

Figure 2:
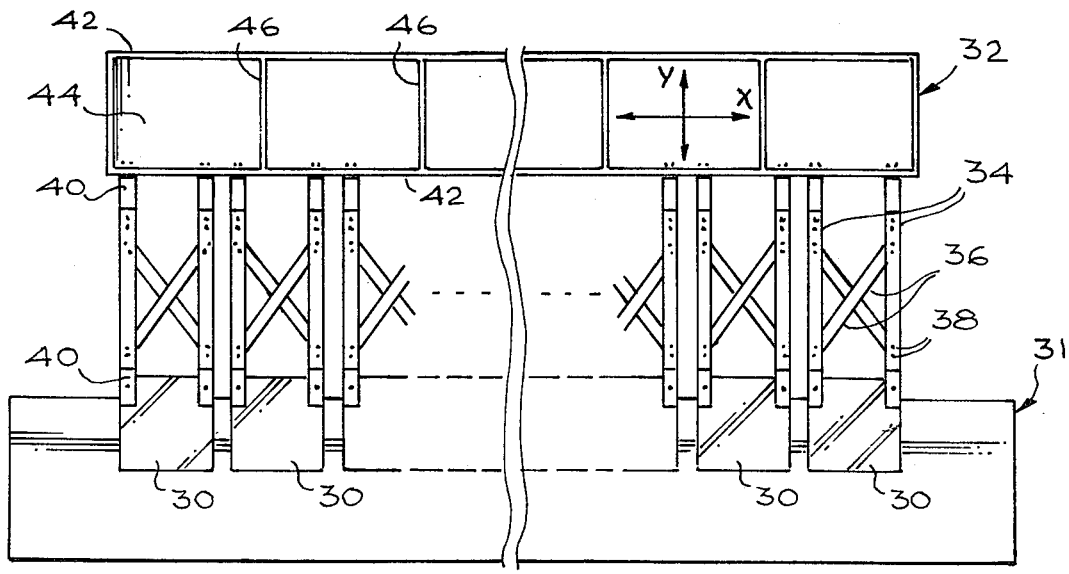
FIG. 2 is a schematic plan view of a portion of the system of FIG. 1.

A central feature of arrangements in accordance with the present invention is the movement of the workpieces relative to the drilling stations, rather than maintaining the workpieces stationary at a drilling position and moving the drills over the work. This is accomplished by affixing the circuit boards to a plurality of carrier plates, one for each work station. FIG. 2 shows an extended work table 31 with a plurality of carrier plates 30 coupled to a central longitudinal drive frame member 32 by pairs of transverse struts 34 rigidly fastened together by cross members 36 by a plurality of fasteners 38. These fasteners may be rivets, machine screws, pins or the like, or welding may be employed to fasten the members 34, 36 together in a rigid configuration. The struts 34 are attached at their opposite ends to leaf springs 40 which are in turn connected at the inboard end to the longitudinal drive frame member 32 and at the outboard ends to the carrier plates 30. A corresponding set of carrier plates 30, springs 40 and interconnecting struts, cross members, etc. (not shown in FIG. 2) is attached in similar fashion to the otherside of the longitudinal drive frame member 32 (see FIG. 4). As so connected, the carrier plates 30 are rigidly constrained for lateral movement in the horizontal (X-Y) plane as the longitudinal drive frame member is driven in the X and Y directions but are permitted latitude of movement in the vertical (Z-axis) direction because of the flexibility of the leaf springs 40. As indicated in FIGS. 2 and 4, the drive frame member 32 is a rigid box structure constructed of side members 42, a bottom 44 and reinforcing cross members 46, all formed and welded together and rigidly coupled in the horizontal (X-Y) plane to the rows of plates 30 on both sides of the central drive frame member 32.

Figure 3:
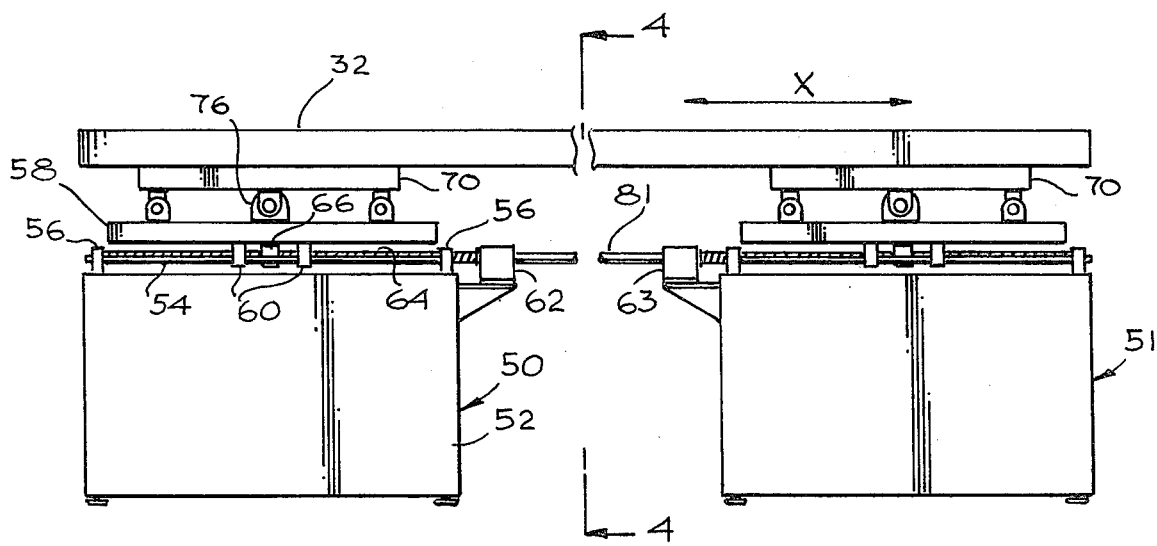
FIG. 3 is a side elevation showing particular details of apparatus employed in the system of FIG. 1.
Figure 4:
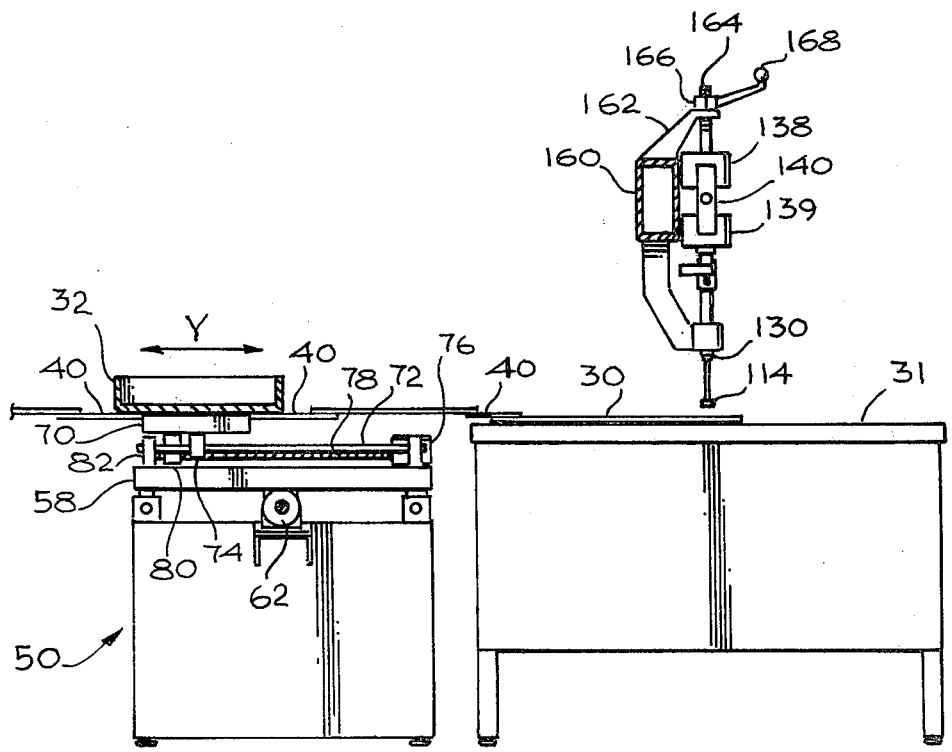
FIG. 4 is an end elevational view showing further details of the apparatus of FIG. 3 as viewd from the right-hand end of FIG. 2.

As shown in FIGS. 3 and 4, the drive frame member 32 is mounted on a pair of X- and Y-drive tables 50, 51. These are commercially available units having a base 52 on which a pair of ways 54 are mounted by supports 56. A first movable bed 58 is supported for movement along the ways 54 by means of ball bushings 60. The base 52 of table 50 supports a stepping motor 62 which drives a threaded rod 64 coupled to the bed 58 by a follower 66. The stepping motor 62 is responsive to X-position signals from the central control unit 14 as directed by the program on the tape 16 (FIG. 1) to drive the first bed 58 to a selected X position.

A second bed 70 is mounted on the first bed 58 in a similar arrangement comprising ways 72, ball bushings 74, Y-direction stepping motor 76, threaded rod 78, follower 80 and way supports 82. By this arrangement (see particularly FIG. 4) the stepping motor 76, in response to Y-direction signals from the control unit 14, serves to drive the second bed 70 in the Y direction. Of course, the second bed is also moved in the X direction as the first bed 58 is moved in the X direction in response to the activation of the stepping motor 62. Thus, the longitudinal drive frame member 32 which is secured to the second beds 70 of the two drive tables 50, 51 is moved in the X and Y directions under the control of the control unit 14.

The two X-Y drive tables 50 and 51 of FIG. 3 are identical. However, they are oriented in opposite longitudinal directions with respect to each other so that the X-direction stepping motors 62 and 63 are adjacent one another. I have found it beneficial to attach a shaft 81 between the rotors of the stepping motors 62, 63. Although the stepping motors 62, 63 are supposed to be identical and they receive the same signals from the control unit 14, I have encountered a certain drag in the movement of the longitudinal drive member 32 in the X direction when the shaft 81 is omitted. I interpret this to be due to slight inherent differences in the response times of the two stepping motors 62, 63 which are otherwise interconnected through the drive member 32. Coupling the rotors of the stepping motors 62, 63 directly together via the shaft 81 has eliminated the resistance to movement or drag in the X direction. I employ two drive tables 50, 51 mounted at opposite ends of the longitudinal drive member 32, rather than a single drive table as in conventional systems, in order to eliminate any possibility of skewing in the transverse direction, as might be the case if only a single table, centrally mounted, were employed. By virtue of this drive arrangement in accordance with the invention, the enire positioning system of multiple carrier plates as shown in FIG. 2 moves in unison in response to signals from the central control unit 14 with the precision afforded by the combination of a single work table and associated control unit of prior art devices.

Particular details of the structure of a single drilling machine at an individual work station may be best understood by reference to FIGS. 5–7. These figures show a carrier plate 30 with a plurality of printed circuit boards 100 mounted underneath the carrier plate 30 by means of locator pins (not shown). The carrier plate 30 and boards 100 are supported above the work table 31 by means of a film of air so that they are free to move laterally as driven by the X-Y drive system of FIG. 2 without frictional engagement with the table 31. Details of the air film support system will be shown and described in conjunction with FIGS. 8 and 9.

The drilling machine 110 comprises an upper portion 112 including a pressure foot 114 which is movable vertically in order to press the plate 30 and circuit boards 100 downward against the table 31 in preparation for the drilling of a hole at a selected position in the boards 100. Drilling is effected from underneath by a drill bit 116 mounted in a chuck 118 in a drill head 120 which is part of the lower portion 122 of the machine 110 mounted below the table 31. The upper portion 112 is shown in FIG. 5 as comprising a chuck 130 releasably engaging the pressure foot 114. The chuck 130 is suspended from the rod 132 which is connected in a spring loaded clevis 134 connected to an actuator rod 136 coupled to an upper actuator 138 and a lower actuator 139. These actuators 138, 139 are in turn coupled via solenoid valve 140 to an air line 142. Mounted on the clevis 134 are a pair of micro-switches 144, 145 which are in operative engagement with the clevis pin 146. A spring 148 biases the rod end of the clevis 134 downwardly, relative to the clevis yoke 135. The rod 132 is guided in its vertical movement by a guide 131 containing a linear ball bearing.

As may be seen in FIG. 6, which is a side view of the clevis 134 as shown in FIG. 5, the clevis yoke 135 is provided with a vertically elongated opening 150 for the clevis pin 146. This opening 150 is shown in exaggerated form for purposes of illustration. This slot is actually elongated by only about 0.020 inch from a true circle and can be formed by a dual drilling operation with the centers displaced by 0.020 inch. As the clevis yoke 135 is driven downwardly by the upper actuator 138, it drives the pressure foot 114 against the carrier plate 30, forcing the carrier plate 30 and boards 100 into contact with the table 31. When the pressure foot 114 no longer moves downwardly, the rod end of the clevis 134 carries the pin 146 to the upper end of the slot 150, overcoming the biasing force of the spring 148, and in so doing activates both of the micro-switches 144, 145, causing them to change state. Switch 145, normally open, is closed and provides a signal to the solenoid circuit of the actuator of the lower portion 122. Switch 144, normally closed, is opened and serves to block any signal from being sent to the control unit signifying completion of the drilling cycle until the pressure foot 114 is withdrawn from contact with the carrier plate 30 following the drilling of the holes at the preselected position.

The entire upper portion 112 is supported from a rigidly guyed truss 160 which extends longitudinally through all of the drilling positions on one side of the drive frame member 32. The entire upper portion 112 is suspended from a support 162 attached to the truss 160 by means of a threaded rod 164 engaging a nut 166 to which is attached a handle 168. Rotation of the handle 168 serves to provide vertical adjustment of the upper portion 112 in order to control the intended travel of the pressure foot 114. This adjustment is performed, for example, when the number of boards 100 mounted to the carrier plate 30 is changed. In the operation of the drilling machine 110, anywhere from one to five circuit boards 100 may be mounted to the carrier plate 30 for the hole drilling operation with satisfactory results.

In the upper portion 112, the upper actuator 138 is operative to drive the pressure foot 114 downwardly while the lower actuator 139 is operative to raise the pressure foot 114. A collar 170, of a material such as molded nylon or the like, is positioned on the rod of the upper clevis yoke 135 at the limit of travel in the upper direction. This serves to provide a slight delay in the downward movement of the pressure foot 114 under the influence of the actuator 138, since it insures that the piston in the actuator 138 cannot move all the way to the top of its actuator cylinder. Thus, when air from the pressure line 142 first enters the cylinder of the actuator 138 via the solenoid valve 140, it must pressurize the space remaining in the cylinder before the piston is driven downwardly. This occasions a delay in the downward movement of the movement of the pressure foot 114 following the application of the energizing signal to the solenoid 140. This delay is utilized to permit the master table to determine if the carrier plates and circuit boards are positioned at the proper location for the holes to be drilled.

The lower portion 122 of the drilling machine 110 is illustrated in FIGS. 5 and 7 as comprising the drill head 120, actuators 178 and 179, solenoid valve 180, pivot support arm 182 and actuator lever 184. The drill head 120 further includes a motor within the housing 186 directly coupled to drive the chuck 118 and drill bit 116. The drill head 120 is supported by the support member 182 and actuator lever 184 for vertical movement, guided by the shaft 190 attached to the table 31 and its associated linear bearing 192. The actuators 178 and 179 and their associated solenoid valve 180 are identical to the actuators 138, 139 and associated solenoid valve 140 in the upper portion 112 of the drilling machine. However, they have dash pot 194 engaging the actuator plunger so as to slow its downward motion, thus reducing the rate at which the motor head 120 is raised for the drilling operation when the actuator 178 is energized. As shown in FIG. 7, the actuator and valve assembly is suspended from the table 31 by a support rod 196. The pivot support arm 182 is similarly suspended from the table 31. The arm 182 has mounted thereon a microswitch 198 which is operated by engagement with the upper end of a threaded push rod 200 attached to the actuator lever 184. Closing the switch 198 serves to establish a circuit to the lower valve in the solenoid valve 180 to energize the down-drive actuator 179 and withdraw the drill head 120 from the upper limit of its travel. Thus the depth of the drilling is controlled by adjusting the threadable push rod 200 to control the point at which it activates the switch 198.

The return of the drill head 120 to its home (retracted) position is detected by a second threaded push rod 202 mounted in an insulated plate 204 so as to contact, and be grounded by, the actuator lever 184 at the end of the downward travel of the right end of the lever 184. The plate 204 is suspended from the table 31 by rods 206 and insulated therefrom by insulating bushings 208. A conductor 210 leading to the control box 212 carries the grounding signal to the control circuitry to indicate that the drill head 120 has been fully retracted.

The drill head 120 further carries an insulated rod 219 having a contact 221 in the upper end thereof connected by a wire 224 to the control box 212. This rod 219 prevents over-travel of the drill head 120 in the upward direction by contacting the underside of the table 31. Also, the contact 221, by grounding against the table 31, serve to provide an indication of the drilling operation by completing the circuit for an indicator light in the control unit 212.

Figure 8:
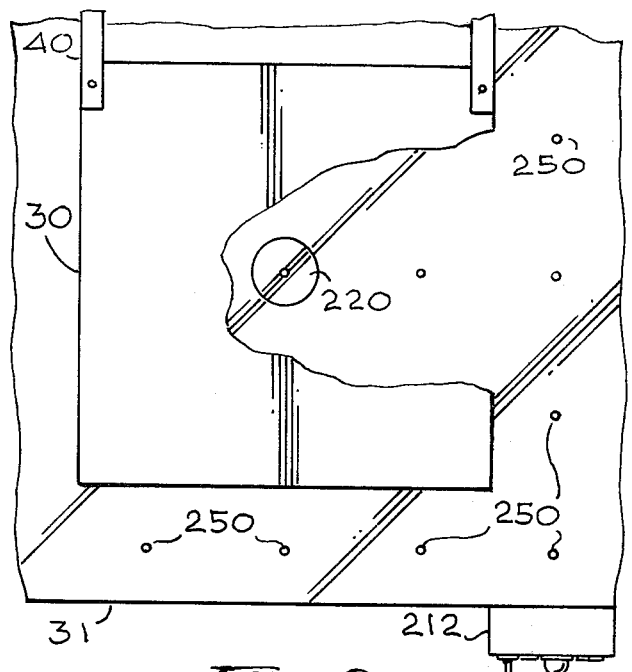
FIG. 8 is a plan view, partially broken away, illustrating particular features of the system of the invention.

The drill bit 16 reaches the circuit boards 100 through a central bushing in a removable bushing plate 220 (also shown in FIG. 8). This bushing plate 220 is recessed to fit flush with the upper surface of the table 31 and is supported on a lip 222. The bushing plate 220 is formed with a lower cylindrical portion of reduced diameter, matching the diameter of the table lip portion 222. The bushing plate 220 is removed whenever it becomes necessary to have access to the drill bit 116 and chuck 118, as for example when the drill bit is to be changed. Removal of the bushing plate 220 is facilitated by the provision of an air passage 228 which extends from the control box 212 to the upper side of the lip 222 adjacent the bushing plate 220. To lift the bushing plate 220, the operator presses a valve in the control panel 220 which pressurizes the passage 228. The configuration of the bushing plate 220 causes it to act like a piston within the mating configuration of the opening in the table 31 so that the air pressure introduced underneath the outer edge of the bushing plate 220 serves to lift it out of the opening in which it is positioned.

Since the drilling of the circuit boards 100 is effected from underneath, the shavings are dropped down along the drill bit 116 and are collected in a well 230 below the bushing plate 220. A vacuum line 232 is connected to the well 230 and serves to remove the shavings from the machine for disposal via a plenum chamber (not shown).

An individual control panel 212 is provided for each separate station and is shown in FIG. 5 as including an on-off switch 240 for electrically disconnecting the associated drilling machine 110. The panel 212 also includes an indicator light 242 which flashes each time the drill head 120 completes its upward travel and a plurality of control buttons 244 for operating the various pneumatic and electrical systems incorporated in the machine.

Figure 9:
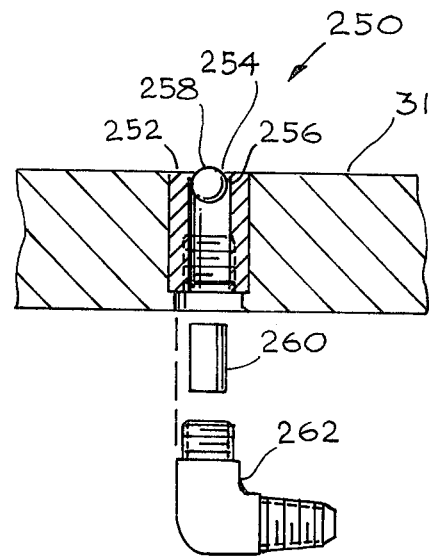
FIG. 9 is an exploded view in section of a particular portion of the arrangement of FIG. 8.

Details of the system for supporting the carrier plates 30 and circuit boards 100 without frictional contact with the table 31 are shown in FIGS. 8 and 9. As shown in FIG. 8, a plurality of air valves 250 including upper orifices are mounted in the upper surface of the table 31 on approximately six-inch centers. As shown in FIG. 9, each of the air valves 250 comprises a hollow cylindrical member 252 having a flat upper face flush-mounted with the upper surface of the table 31. The upper face of the member 252 contains a central orifice 254 of reduced diameter relative to the hollow opening through the remainder of the member 252. On the underside of the orifice 254 is a seat 256, preferably bevelled slightly to match the adjacent surface of the small ball or sphere 258 shown positioned therein. Completing the valve 250 is a hollow spacer tube 260 and a fitting 262, shown in the form of an elbow, for threading into the lower end of the member 252.

With pressurized air applied from a pressure source via the fitting 262, the ball 258, held adjacent the upper opening in the member 252, is driven against the seat 256 by the air within. This closes the valve, blocking the escape of air therefrom, and causes the ball 258 to project approximately 0.020 inch above the surface of the table 31. However, any object moving across the table 31 within the 0.020 inch dimension contacts the ball 258 and drives it downwardly within the member 252, so that air is released past the ball and through the aperture 254. For a planar object, such as the carrier plate 30 or a circuit board 100 mounted thereunder, the escaping air joins with air from other valves 250 similarly actuated to form a pressurized support film which lifts the carrier plate and circuit boards away from contact with the table 31 and maintains a spacing of approximately 0.010 to 0.015 inch unless driven downwardly by the pressure foot 114. Thus, the carrier plates 31 and attached circuit boards 100 are readily movable in any direction in the horizontal plane under the driving force of the central drive frame member 32 without any frictional resistance from the table surface over which they are moved. As each set of carrier plate and associated circuit boards moves over another row of valves 250, they contact the projecting surface of the ball 258 and open the valves 250 as described. When they move to uncover a row of valves 250, the pressurized air within the valve forces the ball 258 upwardly against the seat 256 and closes the valve against further release of air therefrom. Thus, the film used to support the carrier plates 30 and associated circuit boards is developed from only those valves 250 which are underneath the carrier plates and no air is lost from valves not so situated.

The master work station is equipped with apparatus like the drilling machines at other positions with two specific differences. It includes the drilling apparatus per se of the lower portion 122 of FIG. 7. It also includes the apparatus of the upper portion 112 of FIG. 5 except that the collar 170 is omitted. Therefore, the piston in the down-drive actuator 138 closes to minimum cylinder volume in the up position, by contrast with the position of the pistons in the actuators 138 of the other work positions as described hereinabove. Consequently, when a down-drive signal is applied in common to the solenoid valves 140 of the master station and all of the other work stations, the foot of the upper portion 112 of the master station is driven downward slightly ahead of those in the work positions. This enables the master station to be used as a monitor to detect whether or not the carrier plates are properly located for the drilling of the next set of holes so that the drills at the work stations may be blocked if the carrier plates are not properly located.

Figure 10:
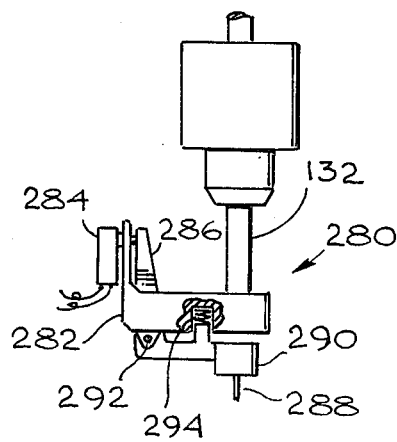
FIG. 10 is a view, partially broken away, of a portion of a machine such as is shown in FIG. 5.

The other difference in the upper portion 112 of the drilling machine at the master station is the provision of a probe foot such as is shown in FIG. 10 in place of the pressure foot 114.

The probe foot 280 of FIG. 10 is mounted on the lower portion of the clevis rod 132 in place of the pressure foot 114 of FIGS. 5 and 7. This device comprises a mounting plate or bracket 282 carrying a micro-switch 284 positioned to be operated by a pivoted probe lever 286. A probe or rod 288 is mounted in a chuck or holder 290 on the end of the lever 286. The lever 286 is pivotably mounted to the bracket 282 by means of a pivot pin 292 and is biased so that the probe 288 is in a downward position by means of a spring 294 bearing against and recessed in the bracket 282.

Prior to the operation of the probe foot 280 at the master position 24 during production use of the system 10 of FIG. 1, the drilling machine at the master station will have been used to drill a master template as already described. This serves as a check on the tape which contains the program for driving the control unit 14. After the drilling of the master template through the use of the master station in the manner already described for the drilling machine 110 of FIGS. 5 and 7, the template is inspected and checked against the designer's original plans from which the program on the tape 16 is generated. Once the master template is approved, it is mounted in position on top of the carrier plate 30 at the master station and the probe foot 280 is installed in place of the pressure foot 114. The respective carrier plates 30 at the various work stations are also loaded with the printed circuit boards 100 in preparation for a production drilling of the various printed circuit boards according to the program on the tape 16 driving the control unit 14. Thereafter the production cycle is initiated under the control of the control unit 14 and, as the carrier plates 30 are moved from position to position with the initiating signals being sent to the master station and the operating work stations each time a new hole position is located, the probe 288 is driven downwardly into the hole in the master template at the selected position. The probe 288 is the same size or perhaps slightly less diameter than the drill used in drilling the holes in the master template. Thus, if the work is precisely and properly located, the probe 288 enters the hole in the master template at the selected position and immediately thereafter, following the delay occasioned by the spacers 170 in the drilling machines 110, the pressure feet 114 are driven against the carrier plates 30 in the respective work stations, moving the circuit boards 100 firmly against the table 31 and holding them in fixed position momentarily while the drill heads 120 move upwardly as the drills 116 drill through the circuit boards 100. However, should there be an error so that the carrier plates and the circuit boards are located at a position where no hole is to be drilled or if they are slightly off the proper position, the probe 288 will encounter the master template rather than moving down into a hole in the template. This causes the lever arm 286 to pivot against the spring 294 and operate the switch 284 which immediately interrupts the circuit to the actuators 178 in the lower portion 122 of the drilling machines 110 so that the drill heads 120 do not perform the drilling operation. This stops the entire system and signals an operator who can then identify the error and take steps to correct it before the erroneous drilling operation will have been performed with the result that the entire lot of circuit boards might be ruined. It may be noted that during the operation of the master station in the manner described, the lower portion 122 of the drilling machine at that station is deactivated so that its drill is not operated.

Figure 11:
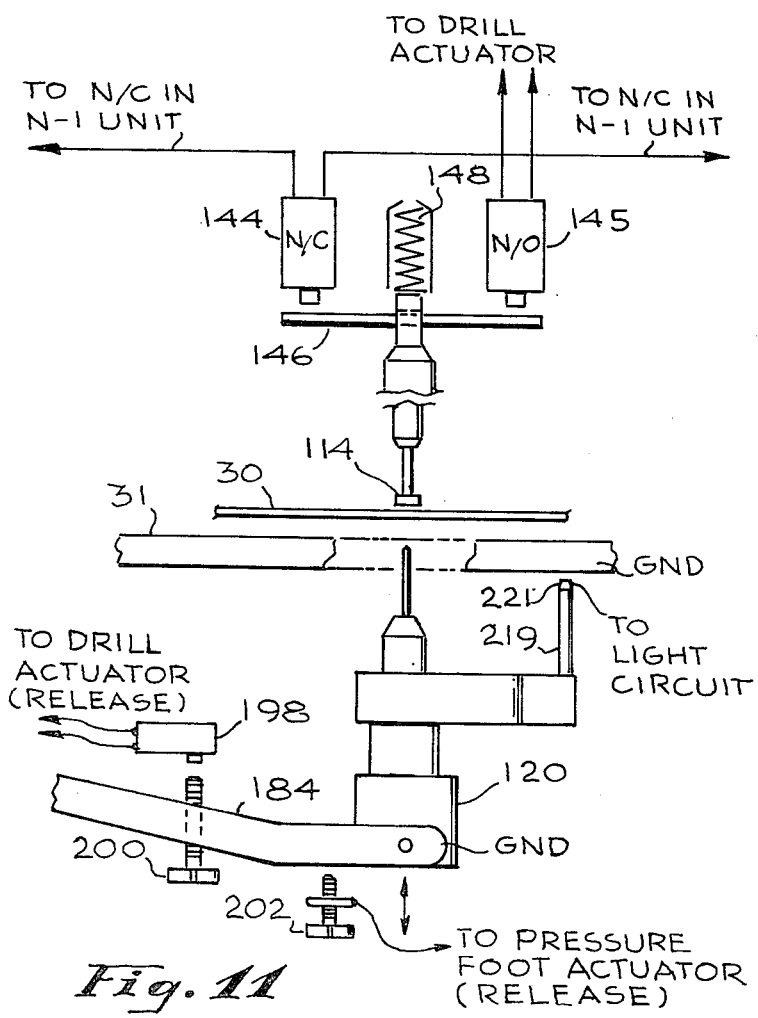
FIG. 11 is a schematic diagram illustrating particular portions of the arrangement shown in FIG. 5.

FIG. 11 is a schematic diagram illustrating the interlocking arrangement of the various switches and contacts which have been described hereinabove. To initiate a drilling cycle, the control unit 14 provides the signals to the stepping motors of the drive units 18 to position the carrier plates with the attached circuit boards at the respective drilling stations at the location of a hole to be drilled. Thereafter, the control unit 14 sends a signal via line 20 to the drilling stations 12 to cause the solenoid valves 140 to activate the down-drive pneumatic actuators 138 (see FIGS. 1 and 5). The resulting movement of the pressure foot 114 to the downward position drives the carrier plate 30 with attached circuit boards against the table 31 and also causes the clevis pin 146 to change the state of the switches 144 and 145. Switch 145, being a normally open switch, now closes and provides an activating signal to the drill actuator 178 (FIG. 7). This moves the lever arm 184 as shown in FIG. 11 in the upward position until the adjustable push rod 200 reaches the switch 198 and causes that switch to close. The closing of switch 198 provides a signal to the lower valve in solenoid valve 180 to operate the lower or release actuator 179 so as to retract the drill head 120. When the drill head 120 reaches its uppermost position so that the contact 221 on the standoff insulator 219 touches the grounded table 31, a circuit to the indicator light on the control panel is closed, thus indicating to the operator that the drill head 120 has travelled to the position at which drilling was completed. Retraction of the drill head 120 to the home position (following activation of the release actuator 179) causes the bar 184 to contact the adjustable (insulated) push rod 202, thus grounding the rod and completing a circuit to energize the release actuator 139 in the upper portion 112 controlling the pressure foot 114. This causes the pressure foot 114 to be raised and in so doing, the normally closed switch 144 (previously maintained in the open position as long as the pressure foot 114 is in engagement with the carrier plate 30) closes and completes the portion of the circuit associated with the individual drilling machine which indicates that that drilling machine is now ready for the work to be moved to the next hole position. The switch 144 is in series circuit with corresponding switches in all other operative units. This circuit must be closed through all such units before the cycle-complete signal can be provided to the control unit 14 so that positioning signals can be sent to the drive units 18 to move the positioning carriage to the next position.

Through the utilization of systems in accordance with the present invention as described hereinabove, the rate of production in the drilling of holes in printed circuit boards is substantially increased while the unit cost of drilling such holes is reduced. This is accomplished in a mass production system which provides improved quality of production by virtue of the capability of testing each hole position before drilling is actually commenced to determine that the work and the drills are properly aligned. Because of the replication capability of the system in which a large number of work stations are all operated in unison, all with complete precision under the control of a single central control unit, the rate of production is several times that which is possible by the use of machines which are now available commercially. For example, in the preferred embodiment of the system as described herein, incorporating nineteen work stations and a master station with five circuit boards being mounted at each work station, and operating at a typical rate of two drilling operations per second, a rate of nearly 700,000 holes per hour is realized, which is from five to ten times the rate of commercially available equipment. Moreover, the system of the present invention is vastly simpler in its structure and operation than commercially available equipment for the purpose, is easier to repair and is less prone to breakdown. Furthermore, if trouble develops in a given work station, it can simply be disconnected from the circuit and the system can be operated without depending on that work station. Likewise, if a limited production run is to be processed, the circuit boards can be mounted on as few work stations as are needed and the rest can be disconnected.

Although there have been described above specific arrangements for a hole drilling machine and work positioning system in accordance with the invention for the purpose of illustrating the manner in which the invention may be used to advantage, it will be appreciated that the invention is not limited thereto. Accordingly, any and all modifications, variations or equivalent arrangements which may occur to those skilled in the art should be considered to be within the scope of the invention as defined in the appended claims.

What is claimed is:

1. A hole drilling machine comprising:
   a plurality of work stations, each including a work table, a work carrier, and a tool for performing a work operation;
   a common drive frame;
   means rigidly coupling the respective work carriers to the common drive frame for moving the respective carriers in any direction along their associated work tables while permitting movement of the carriers toward and away from their associated work tables;
   means for precisely controlling the movement and position of the drive frame; and
   means for supporting the carriers adjacent their associated work tables without frictional contact therewith.

2. The apparatus of claim 1 further comprising means for selectively activating predetermined ones of the work stations.

3. Apparatus in accordance with claim 1 further comprising means at each work station for selectively urging the carrier thereof against the supporting means and into frictional engagement with the work table.

4. The apparatus of claim 1 wherein the drive frame comprises an elongated longitudinal member, and the respective work stations are arrayed in two rows on opposite sides of the elongated member with the carrier coupling means extending transversely of the longitudinal member.

5. The apparatus of claim 4 wherein the driving means further comprises X-Y positioning means attached to the drive frame for determining the movement and position thereof, and an automatic control unit coupled to the X-Y positioning means to control said last-mentioned means in accordance with a prepared program.

6. The apparatus of claim 5 wherein X-Y positioning means comprises a pair of X-Y drive tables attached to the drive frame in alignment along the longitudinal direction thereof and spaced apart from each other in said longitudinal direction.

7. The apparatus of claim 6 wherein each of the two X-Y drive tables includes a drive motor for developing longitudinal movement of the drive frame in response to signals from the control unit.

8. The apparatus of claim 7 wherein each of said motors is a stepping motor including a rotor, wherein said rotors are aligned in the longitudinal direction, and further including means extending between said rotors and rigidly coupling the two together for joint rotation thereof.

9. The apparatus of claim 7 wherein each drive table further includes a driving motor for developing movement of the drive frame in a transverse direction in response to signals from the controller.

10. The apparatus of claim 8 wherein said rotor coupling means comprises a rigid shaft connecting the two rotors together and rotatable therewith.

11. The apparatus of claim 1 wherein the adjacent surfaces of the respective carriers and associated work tables are substantially planar, and wherein the carrier supporting means comprises means for introducing a film of air into the region between said surfaces.

12. The apparatus of claim 11 wherein the introducing means comprises a plurality of individual means spaced apart from each other for injecting a plurality of streams of air at selected locations relative to the work table for establishing said film.

13. The apparatus of claim 12 wherein each individual means comprises a valve mounted in the work table and including automatically operable means for opening the valve only when the associated carrier is positioned thereover.

14. The apparatus of claim 13 wherein the valve comprises a housing having an upper end which is flush with the surface of the work table except for an actuating element which projects above said surface for contacting the under surface of the carrier.

15. The apparatus of claim 14 wherein said valve is a ball-type valve including a check ball as the actuating element, and wherein the ball is forced against the interior surface of the housing to block the escape of air from the valve except when pushed downwardly against the direction of air flow.

16. The apparatus of claim 15 wherein said ball and the valve housing are configured to permit the ball in the closed position of the valve to extend approximately 0.020 inch above the surface of the table.

17. Apparatus in accordance with claim 16 further comprising means for providing low pressure air pressurized at approximately 2 to 3 psi to said air valves.

18. The apparatus of claim 1 wherein at least one work station comprises a pressure foot operable to selectively drive the work carrier and work table together in frictional engagement for a subsequent work operation, said tool being selectively operable for performing said work operation.

19. The apparatus of claim 18 wherein said carrier is adapted for attachment of a workpiece thereto in the region between the carrier and the work table.

20. The apparatus of claim 19 wherein said workpiece comprises at least one printed circuit board, and the tool comprises a drill for drilling holes at predetermined positions in said board.

21. The apparatus of claim 18 further comprising means for individually actuating the pressure foot and the tool in interlocking relationship for fail-safe operation.

22. The apparatus of claim 21 wherein said actuating means comprises an electro-pneumatic actuator, one for each of the pressure foot and the work tool, each actuator comprising a double acting piston and a dual solenoid valve associated therewith.

23. The apparatus of claim 22 further comprising a plurality of switches respectively associated with the pressure foot and the work tool, and circuitry interconnecting the switches with the actuator solenoids to prevent the energization of the work tool actuator to drive the work tool toward the carrier until the pressure foot is in position urging the carrier toward the work table.

24. The apparatus of claim 23 wherein said switches include a pair associated with the work tool, the first of said pair of switches being positioned to sense the arrival of the work tool at a terminal drive position and the second of said pair of switches being positioned to sense the work tool in a retracted position.

25. The apparatus of claim 24 wherein the first of said switches is coupled to control the solenoid valve of the work tool actuator for retracting the work tool upon the sensing thereof at the terminal drive position by said first switch.

26. The apparatus of claim 25 wherein the second of said pair of switches is interconnected with the pressure foot actuator to prevent the withdrawal of the pressure foot until the work tool is in the retracted position.

27. The apparatus of claim 26 further including a contact member mounted for movement with the work tool for closing a circuit to an associated signalling element when the work tool is in the terminal drive position.

28. The apparatus of claim 18 further including pressure foot drive means comprising first and second drive rods intercoupled to permit limited longitudinal travel of one with respect to the other and means biasing the two rods to a first juxtaposition state in which the second rod is extended relative to the first rod.

29. The apparatus of claim 28 including clevis joint means coupling the first and second rods together comprising a clevis yoke attached to the first rod and having an opening, a clevis rod attached to the second rod and having an opening, and a clevis pin extending through the openings in the clevis yoke and the clevis rod.

30. The apparatus of claim 29 wherein the openings of the clevis yoke are elongated in the longitudinal direction to permit limited travel of one of the first and second rods with respect to the other.

31. The apparatus of claim 30 further comprising a support frame member extending along the work table for supporting the pressure foot drive means, and further including a guide member attached to the support member for guiding the second rod attached to the pressure foot in the vertical direction.

32. The apparatus of claim 29 further including a second pair of switches associated with the pressure foot drive means and positioned relative thereto so as to change state when the first rod moves longitudinally relative to the second rod.

33. The apparatus of claim 32 further including means mounting the second pair of switches adjacent the clevis yoke for movement therewith, and means attached to the clevis pin for movement with the second rod for causing said switches to change state.

34. The apparatus of claim 33 wherein one of said switches is of the normally open type and the other of said switches is of the normally closed type, the normally open switch being interconnected in circuitry with the solenoid of the associated work tool actuator to prevent the travel of the work tool toward the carrier until the pressure foot is in the downward position holding the carrier against the work table.

35. The apparatus of claim 34 wherein the normally closed switch is in series circuit with corresponding normally closed switches of other work stations to provide a signal to the associated control unit for moving to the next work position only when all of the pressure feet are retracted.

36. The apparatus of claim 22 wherein the work tool actuator further includes a dashpot for slowing the rate of movement of the work tool in response to the activation of its actuator.

37. The apparatus of claim 18 wherein the pressure foot actuator is coupled to be responsive to a signal from the control unit initiating a work operation cycle.

38. The apparatus of claim 18 further including a master station for monitoring the relative positioning of the carriers and work tools at the associated work stations in accordance with the intended relative positions thereof.

39. The apparatus of claim 38 wherein the work stations include drills for drilling holes in printed circuit boards attached to the carriers thereof, and wherein the master station includes means for detecting an error in the positioning of the printed circuit boards at a selected hole location.

40. The apparatus of claim 39 wherein the master station also includes a carrier for a pre-drilled master board, the carrier being coupled to the drive frame for movement in unison with the drive frame and the carriers of the associated work stations, and a vertical drive mechanism responsive to an electro-pneumatic actuator having a double acting piston and a dual solenoid valve associated therewith.

41. The apparatus of claim 40 wherein the vertical drive mechanism is coupled to drive a monitoring probe movable into respective holes in the master board as the carriers and attached boards are moved laterally in response to control signals from the control unit during successive hole drilling cycles.

42. The apparatus of claim 41 further including probe support means normally supporting the probe in an extended position and having a pivoted member adjacent the probe and mounted to activate a disabling switch when the probe is driven out of its extended position, said disabling switch being connected in circuit with the pressure foot actuators of all of the associated work stations, whereby when the probe is moved out of its extended position to activate the disabling switch upon encountering the master board in a position other than one in which a hole is aligned to receive the probe, thus indicating an error in positioning of the boards, the work stations are prevented from performing a drilling operation.

43. The apparatus of claim 42 further including means in the pressure foot drive mechanism of each work station for delaying the movement of the associated pressure foot by a predetermined interval following the energizing of the actuator at the master station.

44. The apparatus of claim 43 wherein the delaying means comprises a spacer preventing the complete withdrawal of the pressure foot by its associated actuator, relative to the withdrawal of the probe at the master station by its actuator, thereby maintaining a substantially greater volume in each work station pressure foot actuator than in the actuator for the master station probe in the retracted position.

45. The apparatus of claim 24 further including switch actuating means associated with the tool for actuating the first and second switches, comprising individual push rods and means for adjusting the positions of said push rods relative to the tool for separately determining the points in the travel of the tool at which the first and second switches are activated.

* * * * *